United States Patent [19]
Mizuguchi

[11] Patent Number: 5,437,560
[45] Date of Patent: Aug. 1, 1995

[54] CIRCUIT BOARD ELECTRICAL CONNECTOR WITH A DOUBLE CANTILEVERED LATCH

[75] Inventor: Shinji Mizuguchi, Tokyo, Japan

[73] Assignee: Hirose Electric Co., Ltd., Tokyo, Japan

[21] Appl. No.: 397,719

[22] Filed: Mar. 2, 1995

Related U.S. Application Data

[63] Continuation of Ser. No. 142,142, Oct. 28, 1993, abandoned.

[30] Foreign Application Priority Data

Apr. 9, 1993 [JP] Japan ................ 5-017992 U

[51] Int. Cl.6 .................................... H01R 9/09
[52] U.S. Cl. ............................ 439/326; 439/328
[58] Field of Search ............ 439/326, 327, 328; 361/785, 787, 801

[56] References Cited

U.S. PATENT DOCUMENTS

| | | | |
|---|---|---|---|
| 4,917,624 | 4/1990 | Yu | 439/328 |
| 4,986,765 | 1/1991 | Korsunsky et al. | 439/326 |
| 5,085,593 | 2/1992 | Tuan | 439/326 |
| 5,267,872 | 12/1993 | Gou et al. | 439/328 X |
| 5,268,820 | 12/1993 | Tseng et al. | 361/785 |

Primary Examiner—Kenneth J. Ramsey
Attorney, Agent, or Firm—Kanesaka & Takeuchi

[57] ABSTRACT

A circuit board electrical connector with a latch includes an insulating housing (110) including a base section (111) with an elongated groove (112) having a plurality of contact elements arranged therein; a pair of side posts (114) extending forwardly from opposite ends of the base section, each being divided into a fixed outer arm (116) and a movable inner arm (117); a movable latch arm (120) extending upwardly from a lower front end portion of the movable inner arm; and an engaging member (121) projecting inwardly from an upper end portion of the latch arm so that when a circuit board is inserted into the elongated groove from upper front and then turned downwardly, the circuit board snaps between the latch arms of the electrical connector.

3 Claims, 6 Drawing Sheets

CIRCUIT BOARD ELECTRICAL CONNECTOR WITH A DOUBLE CANTILEVERED LATCH

This is a continuation of application Ser. No. 142,142, filed Oct. 28, 1993, and now abandoned.

BACKGROUND OF THE INVENTION

1. Field of the Invention

The present invention relates to circuit board electrical connectors enabling to plug in/out, with small forces, a circuit board which has a plurality of contacts aligned at the lower end and, more particularly, to a circuit board electrical connector with a latch enabling to insert the lower end of a circuit board into an elongated groove having a plurality of contacts aligned therein and turn it backward by a redetermined angle for connection.

2. Description of the Related Art

A circuit board electrical connector with a latch of this type is mounted on a mother board, and a daughter board is connected to the mother board by connecting it to the electrical connector. As the mounting density of IC's increases, the mother board often finds itself lack of sufficient mounting space. In addition, there is an increasing demand for a low profile and high density circuit system. Accordingly, there is a need for a compact circuit board electrical connector with a latch which allows high density connection.

Japanese Patent Application Kokai No. 50-33483 discloses that a daughter board is connected to a mother board in parallel to the mother board to thereby meet the low profile requirement. However, the daughter board is connected on only one side so that the connection density is lower than that of two sides.

Japanese Utility Model Application Kokai No. 61-206278 discloses an electrical connector which is connected to opposite sides of a daughter board in a horizontal plane but fails to satisfy the low profile requirement.

In the above connector, the daughter board is inserted into the connector from upper front and then turned downwardly to a horizontal operative position for electrical connection to the mother board. The contacts arranged on the front side and backside of the daughter board are offset so that the daughter board is biased to be turned upwardly in the operative position. Accordingly, it is critical to hold this position to ensure the stability of the electrical connection.

In the above connectors, however, either there is no latch capable of holding the daughter board in the fitting position or the latch is not integrated with the connector. In addition, the latch has a bulky structure and/or is difficult to operate in the high mounting density environment.

SUMMARY OF THE INVENTION

Accordingly, it is an object of the invention to provide a circuit board electrical connector with a latch which overcomes the aforementioned disadvantages.

According to the invention there is provided a circuit board electrical connector with a latch, which includes an insulating housing including a base section with an elongated groove having a plurality of contact elements arranged therein; a pair of side posts extending forwardly from opposite ends of the base section, each being divided into a fixed outer arm and a movable inner arm; a movable latch arm extending upwardly from a lower front end portion of the movable inner arm; and an engaging member projecting inwardly from an upper end portion of the latch arm so that when a circuit board is inserted into the elongated groove from upper front and then turned downwardly, the circuit board snaps between the side posts of the electrical connector.

The above and other objects, features, and advantages of the invention will be more apparent from the following description when taken in conjunction with the accompanying drawings.

DESCRIPTION OF THE PREFERRED EMBODIMENT

Figure 1:
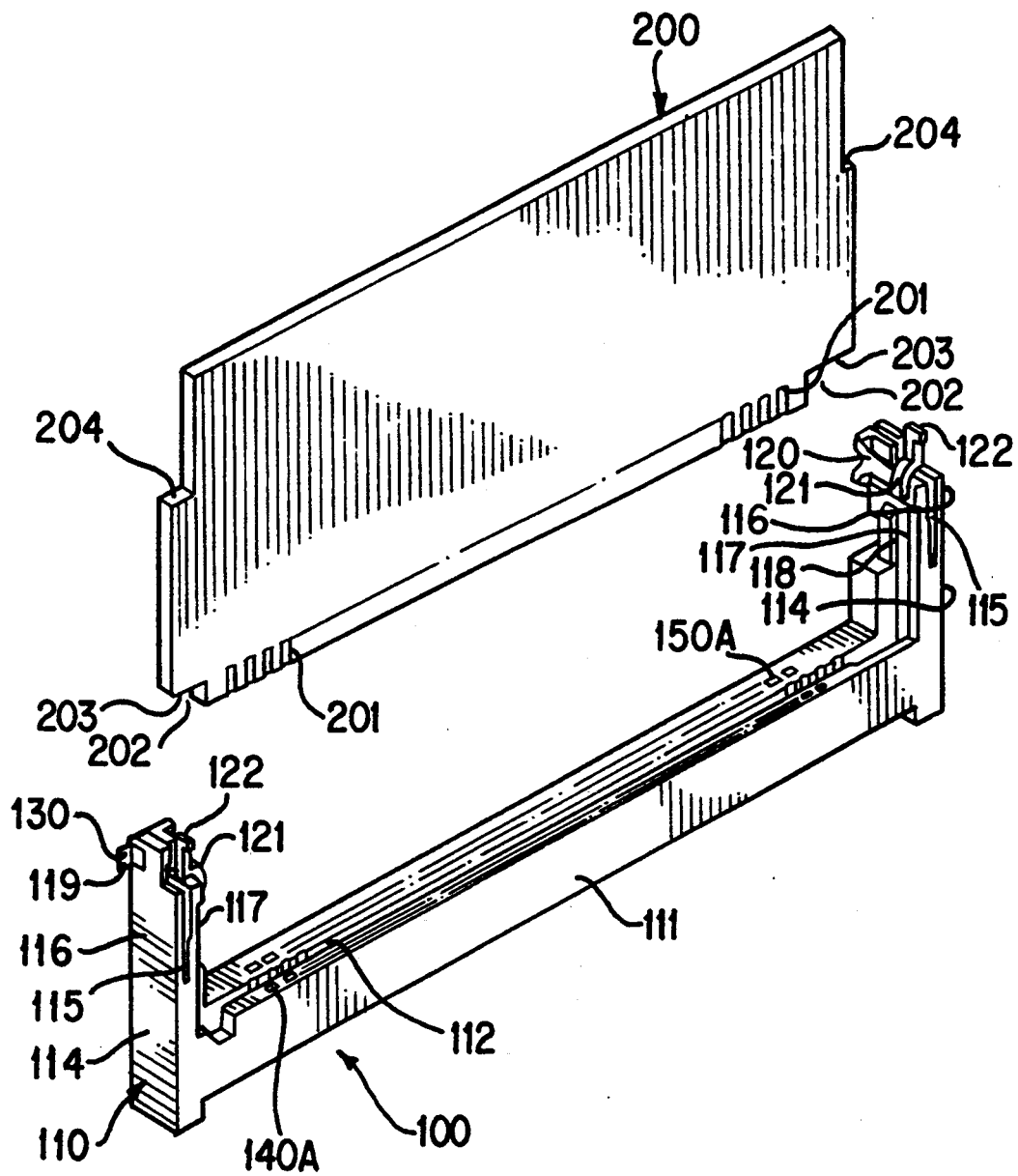
FIG. 1 is a top perspective view of a daughter board and a circuit board electrical,connector with a latch according to an embodiment of the present invention.

In FIG. 1, a circuit board electrical connector with a latch 100 includes an insulating housing 110 made by integral molding from an insulating material such as a plastic. The insulating housing 110 includes a base section 111 having an elongated groove 112 and a pair of side posts 114 extending forwardly from opposite ends thereof.

The front portion of each side post 114 is divided into a fixed outside arm 116 and a cantilevered movable inside arm 117 by a slit 115. A cantilevered movable latch arm 120 extends upwardly from the lower front portion of each movable inside arm 117. An engaging or latch member 121 is provided at the top end of the latch arm 120 for providing a latch function as described below. A manipulation lever 122 extends forwardly from the engaging member 121. The movable arm 117, the latch arm 120, and the engaging member 121 constitute a latch unit. An abutting surface 118 is provided at the rear inside portion of each side post 114 to abut on the backside of a daughter circuit board 200 connected in such a manner as described below. The electrical connector 100 is mounted on a mother board (not shown) by means of fixing metals 130.

A plurality of contacts 201 are arranged on front side and backside with a predetermined pitch along the front edge of the daughter board 200. It is noted that the contacts 201 arranged on the front side are offset by a half pitch from those of the backside. A pair of front notches 202 are formed at opposite front corners of the daughter board 200 to provide abutting surfaces 203. A pair of engaging shoulders 204 are formed on opposite rear corners of the daughter board 200.

Figure 4:
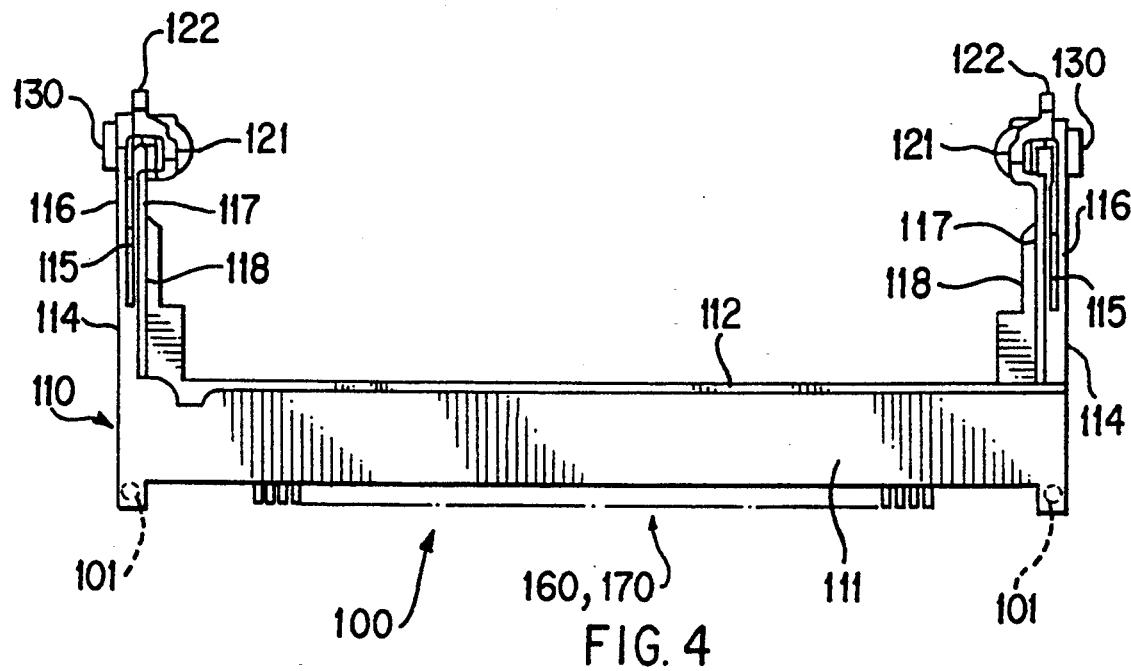
FIG. 4 is a top plan view of the electrical connector.
Figure 5:
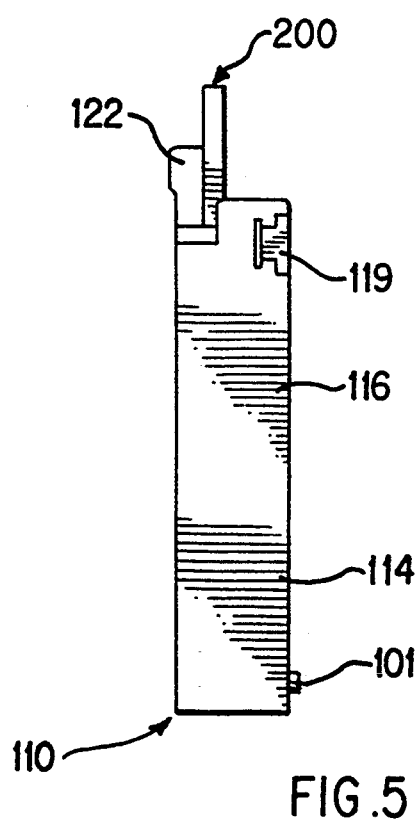
FIG. 5 is a side view of the electrical connector.

In FIGS. 4 and 5, a pair of mounting studs 101 extend downwardly from opposite ends of the base section 111 for positioning and mounting the connector on a mother board. A press-fit recess 119 is formed on the outside of a front end portion of each side post 114 for press-fitting a fixing metal 130. By securing this fixing metal 130 to the mother board, the fixed arm 116 is secured to the mother board.

Figure 6:
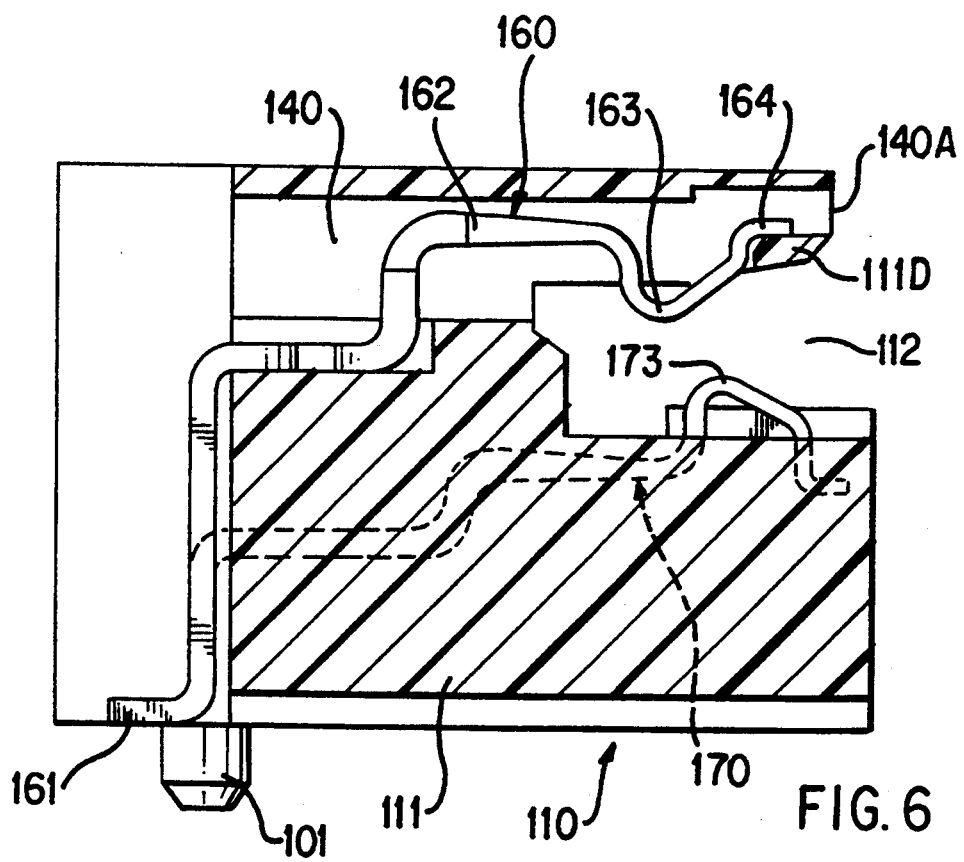
FIG. 6 is a sectional view of the electrical connector cut at the position of a first-type contact element.

In FIG. 6, a plurality of contact receiving cavities 140 are formed on the upper wall of the elongated groove 112 with a pitch equal to that of the contacts 201 on the front side of the daughter board 200. Each contact cavity 140 has a front opening 140A as well as a rear opening.

Figure 7:
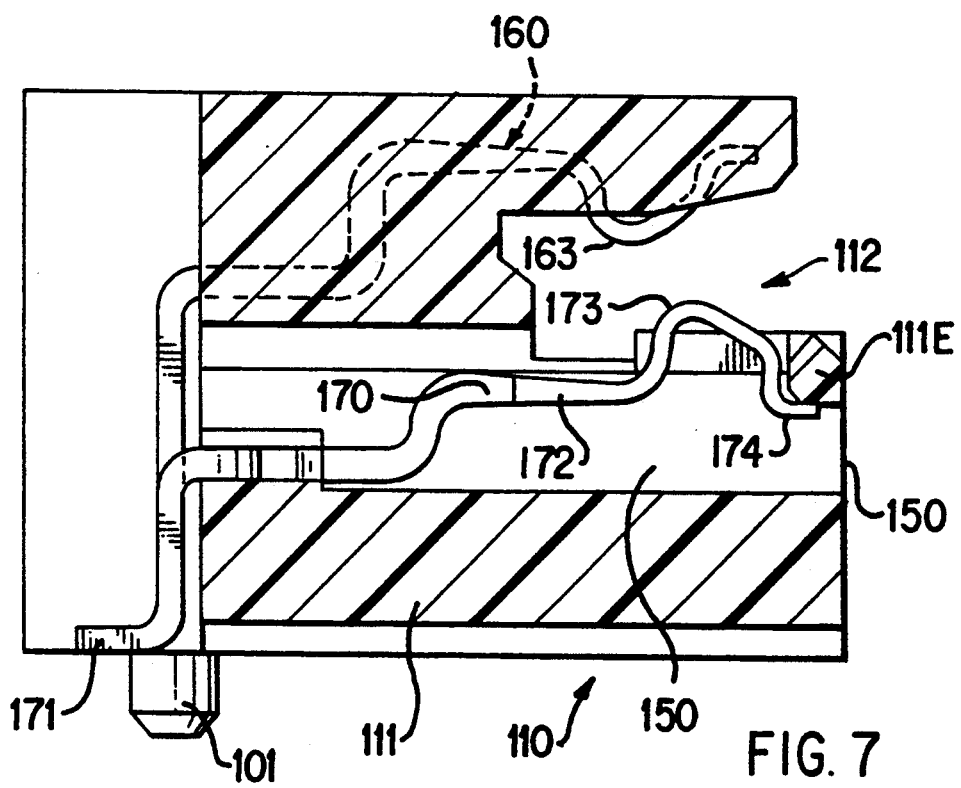
FIG. 7 is a sectional view of the electrical connector cut at the position of a second-type contact element.

In FIG. 7, similarly, a plurality of contact receiving cavities 150 are formed on the lower wall of the elongated groove 112 with a pitch equal to that of the contacts 201 on the backside. Each contact cavity 150 has a front opening 150A as well as a rear opening.

Contact elements 160 of the first type are arranged in the contact cavities 140 while contact elements 170 of the second type are arranged in the contact cavities 150. The first-type contact elements 160 are made by stamping, rolling, and forming from a spring and conductive sheet of material. The second-type contact elements 170 are different in shape from the first ones but are made by the same manner as the first ones.

The first-type contact elements 160 having a configuration as shown in FIG. 6 have a connection portion 161, a spring portion 162, a contact portion 163, and an engaging portion 164. The second-type contact elements 170 having a configuration as shown in FIG. 7 have a connection portion 171, a spring portion 172, a contact portion 173, and an engaging portion 174.

The C-shaped contact portions 163 and 173 are made by rolling, and the spring portions 162 and 172 have a thickness gradually increasing toward the connection portions 161 and 171. The contact elements 160 and 170 are formed substantially in a S-shape so as to reduce not only the entire length but also the stiffness.

The first-type contact elements 160 are arranged in the respective contact cavities 140 such that the connection portions 161 are press fitted to the base section 111 so as to project from the rear end of the base section 111, the engaging portions 164 engage the front inside wall 111D of the contact cavities 140, and that the contact portions 163 are exposed in the elongated groove 112. The respective portions of the contact elements 160 are sized so that the spring portions 162 are preloaded by the engagement between the engaging portions 164 and the front inside wall 111D.

Similarly, the second-type contact elements 170 are arranged in the respective contact cavities 150 such that the connection portions 171 are press fitted to the base section 111 so as to project from the rear end of the base section 111, the engaging portions 174 engage the front inside wall 111E of the contact cavities 150, and that the contact portions 173 are exposed in the elongated groove 112. The respective portions of the contact elements 170 are sized so that the spring portions 172 are preloaded by the engagement between the engaging portions 174 and the front inside wall 111E.

In FIGS. 6 and 7, the contact portions 163 and 173 of the first-type and second-type contact elements 160 and 170 are offset by a half pitch and opposed to each other in the elongated groove 112. The contact portions 173 of the second-type contact elements 170 are disposed in a position closer to the front opening than those of the first-type contact elements 160. To connect a daughter board 200 to the electrical connector 100, the daughter board 200 is inserted into the elongated groove 112 from upper front. The distance between the contact portions 163 and 173 in the direction perpendicular to the insertion direction is substantially equal to or slightly greater than the thickness of the daughter board 200 so as to minimize the force for plugging in/out the circuit board. The distance between the contact portions 163 and 173 in the direction of height of the elongated groove 112 is smaller than the thickness of the circuit board 200 so that satisfactory contact forces are provided between the contacts 210 of the daughter board 200 and the corresponding contact portions 163 and 173 of the connector 100.

Figure 2:
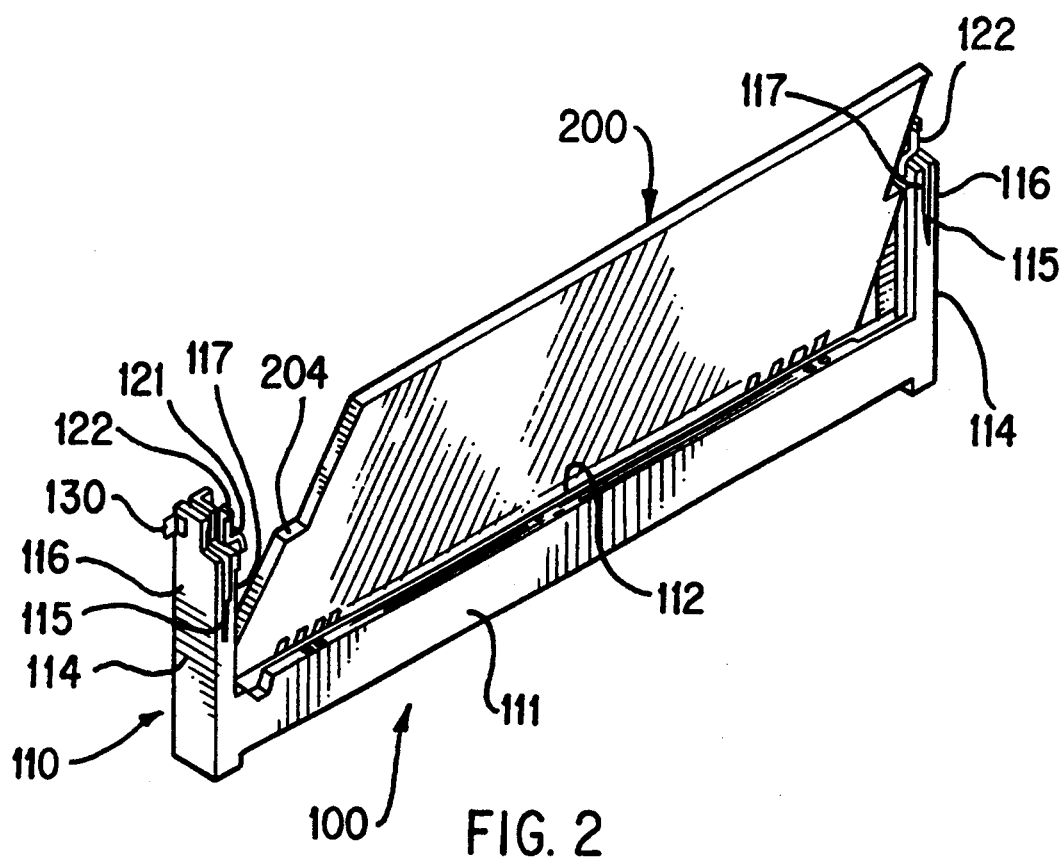
FIG. 2 is a top perspective view showing the daughter board is being inserted into the electrical connector.

In FIG. 2, the front edge of the daughter board 200 is inserted into the elongated groove 112 of the insulating housing 110 from upper front such that the abutting surfaces 203 of the daughter board 200 abut on stopper projections (not shown) provided within the elongated groove 112. The respective portions are sized so that the lower end of the daughter board 200 does not contact the rear wall of the elongated groove 112 when the abutting surfaces 203 abut on the projections.

When the daughter board 200 is turned downwardly to the abutting surfaces 118 of the side posts 114 with the abutting surfaces 203 abutting on the stopper projections, the opposite sides of the daughter board 200 contact the engaging portions 121 of the latch arms 120. Consequently, the latch arms 120 and the movable arms 117 are flexed outwardly so that the opposite sides of the daughter board 200 snaps between the engaging portions 121. The inside surfaces of the engaging portions 121 are tapered so as to facilitate such snap action.

Figure 3:
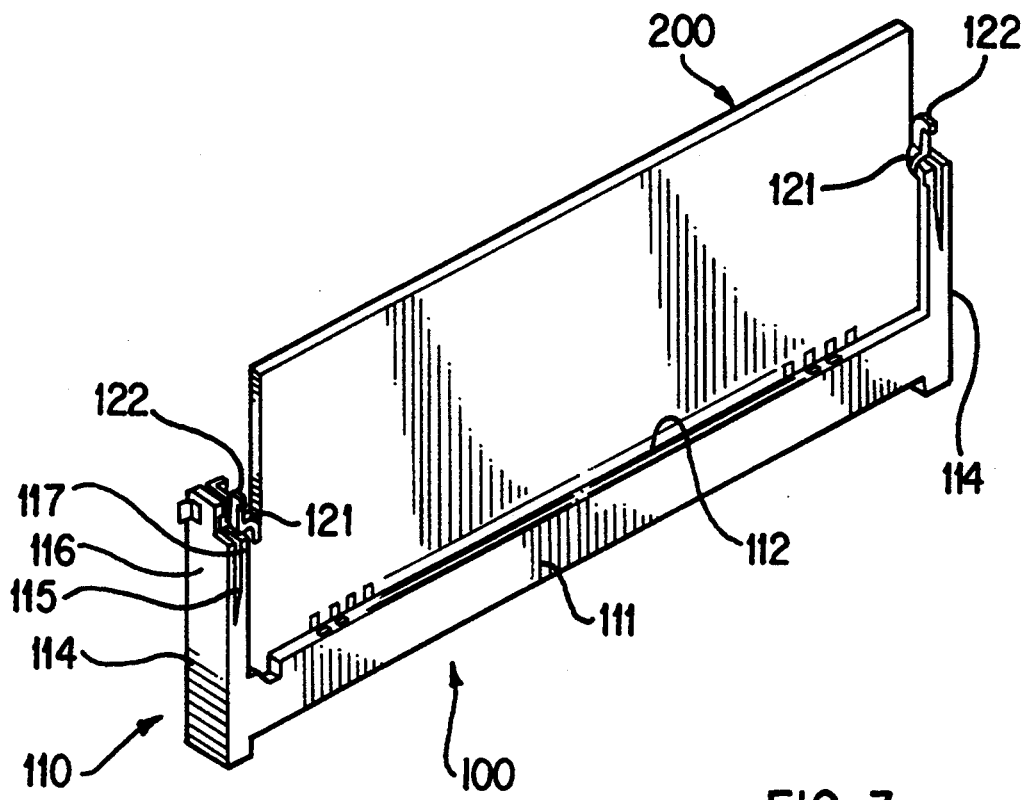
FIG. 3 is a top perspective view showing the daughter board has been connected to the electrical connector.

In FIG. 3, when the daughter board 200 is turned to a horizontal position parallel to the mother board and the opposite sides thereof abut on the abutting surfaces 118 of the side walls 114, the movable arms 117 and the latch arms 120 return to the original position with their own spring forces so that the engaging members 121 grip the opposite sides of the daughter board 200. Thus, the daughter board 200 is held horizontally between the abutting surfaces 118 and the engaging portions 121. The rear shoulders 204 of the daughter board 200 abut the rear surfaces of the latch arms 120 so that the coming off of the daughter board 200 is prevented. Under this condition, the respective contacts 201 of the daughter board 200 are in contact with the corresponding contact portions 163 and 173 of the first-type and second-type contact elements 160 and 170.

In order to remove the daughter board 200, the manipulation levers 122 of the insulating housing 110 are pressed outwardly so as to releasing the engaging member 121 from the opposite sides of the daughter board 200. Then, the daughter board 200 is turned upwardly by the spring force of the first-type and second-type contact elements 160 and 170 arranged along the elongated groove 112 so that the daughter board 200 is pulled out of the elongated groove 112.

Figure 8:
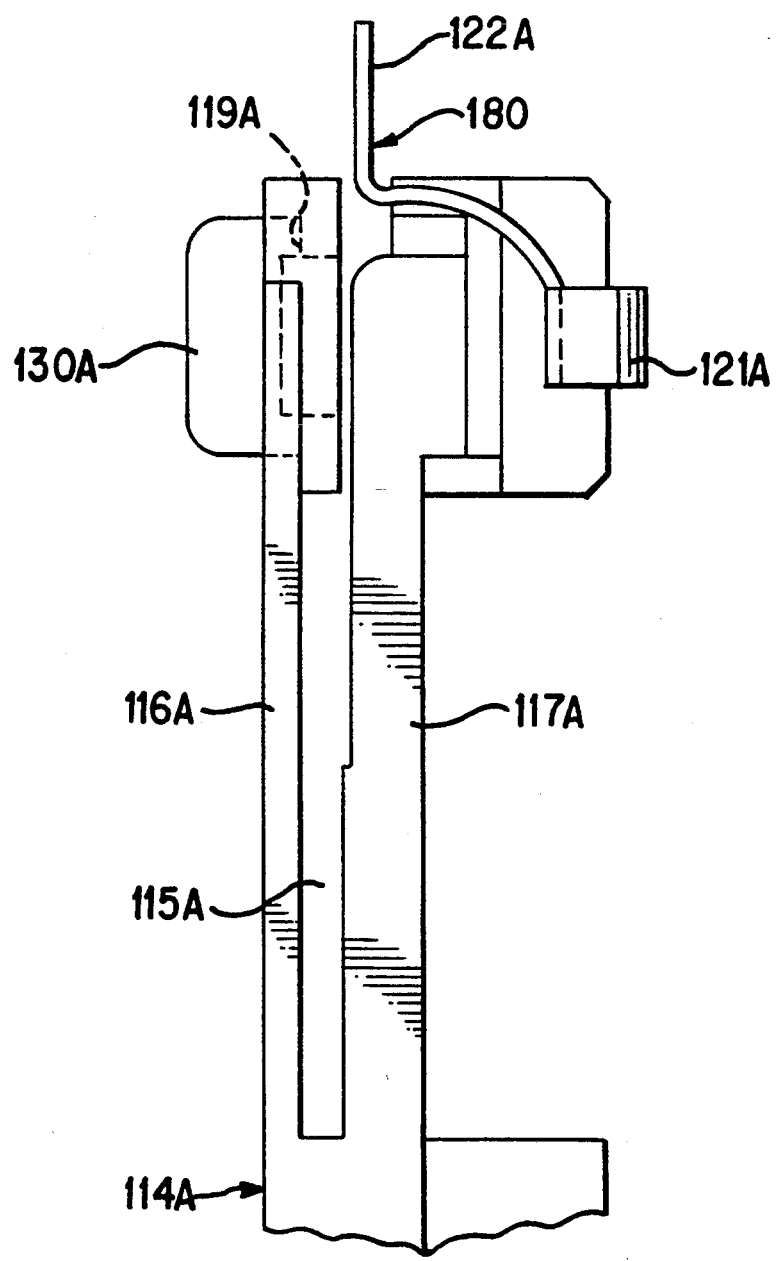
FIG. 8 is a top plan view of a side post of a circuit board electrical connector with a latch according to another embodiment of the invention.
Figure 9:
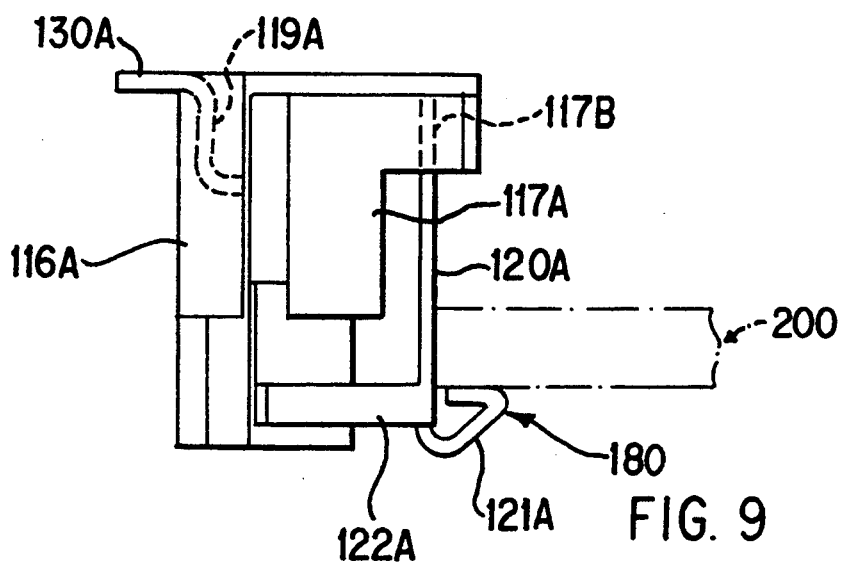
FIG. 9 is a front elevational view of the electrical connector of FIG. 8.
Figure 10:
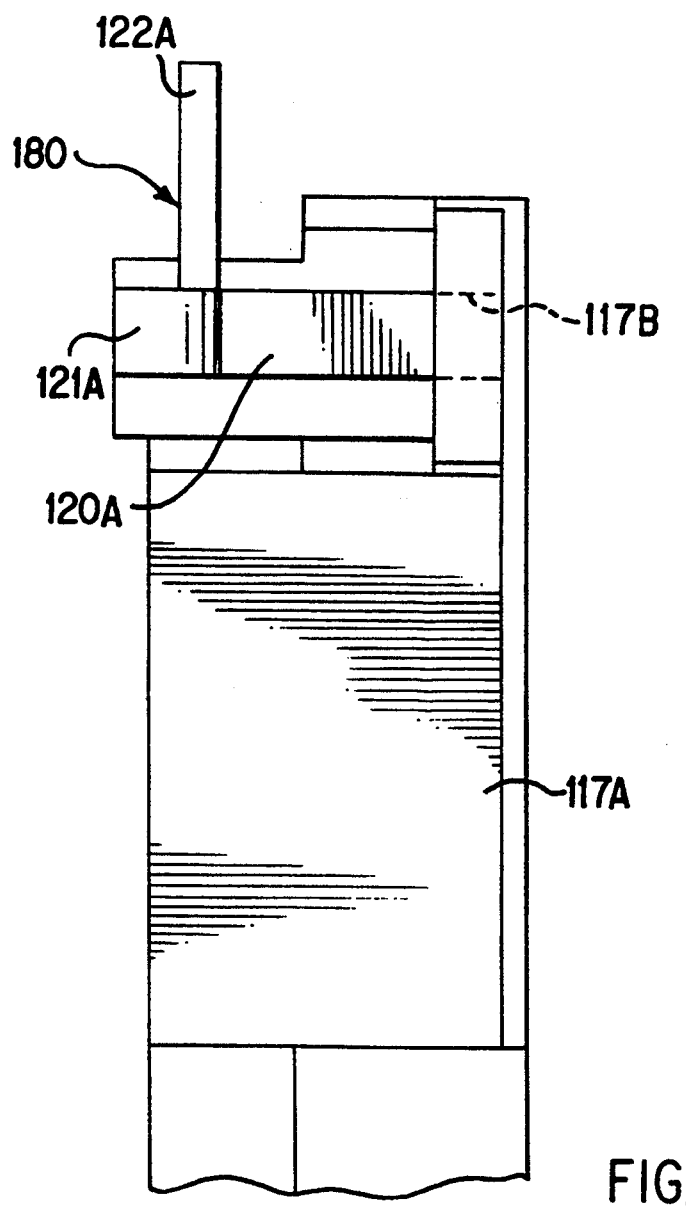
FIG. 10 is a side view of the right-side post of the electrical connector of FIG. 8.

In FIGS. 8-10, a pair of side walls 114A are integrally molded with the insulating housing from a plastic. The front portion of each side post 114A is divided into a fixed arm 116A and a movable arm 117A by a slit 115A. A press-fit recess 119A is formed at the front portion of the fixed arm 116, and a fixing metal 130A is press fitted into the recess 119A.

In this embodiment there is provided a metal latch member 180 which has a movable latch arm 120A, an engaging portion 121A, and a manipulating lever 122A. The metal member 180 is stamped and formed from a spring metal sheet and connected to the front portion of the movable arm 117A of plastic by press fitting the end portion of the movable latch arm 120A into the press-fit recess 117B of the movable arm 117A. The movable latch arm 120A, the engaging member 121A, and the manipulating lever 122A function in substantially the same way as the aforementioned movable latch arm 120, the engaging member 121, and the manipulating lever 122.

By making the movable latch arm and engaging member of metal, it is possible to make the latch member not only thinner but also stronger than the plastic latch member.

Since there is provided a combined spring flexure by the first and second cantilevered movable arms, it is possible to provide even in the thin-type latch member an opening sufficiently large and strong to receive both sides of a daughter board.

In addition, with the above double cantilevered arm structure, it is possible to provide a spring characteristic sufficiently large to meet the tolerance of a daughter board, thereby assuring stable contact between the contact elements of the connector and the contacts of the daughter board.

Moreover, the above double cantilevered arm structure enables to plug in or out the daughter board into the latch member with small forces.

I claim:

1. A circuit board electrical connector with a double cantilevered latch, comprising:
   an insulating housing including a base section with an elongated groove having a plurality of contact elements arranged therein;
   a pair of side posts extending forwardly from opposite ends of said base section, each being divided into a fixed outer arm and a cantilevered movable inner arm;
   a cantilevered movable latch arm consisting of a fixed intermediate portion extending inwardly from a portion of said cantilevered movable inner arm and a movable free end portion extending upwardly from said fixed intermediate portion so as to extend in a plane parallel to that of said inner arm; and
   a latch member projecting inwardly from an upper end portion of said movable free end portion of said cantilevered movable latch arm so that when a circuit board is inserted into said elongated groove from upper front and then turned downwardly, said circuit board snaps between said cantilevered movable latch arms of said electrical connector while both said movable inner and latch arms are flexed outwardly sharing an insertion load.

2. The electrical connector of claim 1, wherein said cantilevered movable inner arm, said cantilevered movable latch arm, and said latch member are integrally molded from a plastic material.

3. The electrical connector of claim 1, wherein said cantilevered movable inner arm is molded from a plastic material while said cantilevered movable latch arm and said latch member are made from a spring metal sheet.

* * * * *